US010612754B2

(12) United States Patent
Kiyota et al.

(10) Patent No.: US 10,612,754 B2
(45) Date of Patent: Apr. 7, 2020

(54) METHOD FOR MANUFACTURING LIGHT-EMITTING DEVICE, METHOD FOR MANUFACTURING LASER MODULE, AND LIGHT-EMITTING DEVICE

(71) Applicant: NICHIA CORPORATION, Anan-shi, Tokushima (JP)

(72) Inventors: Seiji Kiyota, Tokushima (JP); Eiichiro Okahisa, Tokushima (JP)

(73) Assignee: NICHIA CORPORATION, Anan-shi (JP)

( * ) Notice: Subject to any disclaimer, the term of this patent is extended or adjusted under 35 U.S.C. 154(b) by 319 days.

(21) Appl. No.: 15/494,640

(22) Filed: Apr. 24, 2017

(65) Prior Publication Data

US 2017/0314768 A1    Nov. 2, 2017

(30) Foreign Application Priority Data

Apr. 28, 2016  (JP) .................................. 2016-090767

(51) Int. Cl.
| | | |
|---|---|---|
| F21V 19/00 | (2006.01) | |
| H01S 5/00 | (2006.01) | |
| H05K 5/00 | (2006.01) | |
| F21K 9/64 | (2016.01) | |
| F21Y 115/30 | (2016.01) | |

(52) U.S. Cl.
CPC ............ *F21V 19/0015* (2013.01); *F21K 9/64* (2016.08); *H01S 5/005* (2013.01); *H05K 5/00* (2013.01); *F21Y 2115/30* (2016.08)

(58) Field of Classification Search
CPC .. H01S 5/02268; H01S 5/022; H01S 5/02208; H01S 5/02236; H01S 5/02248; H01S 5/02252; H01S 5/02256; H01S 5/0228; H01S 5/02288; H01S 5/02292; H01S 5/02296; H01S 5/02469; F21V 19/0015; F21K 9/64; F21Y 2115/30
See application file for complete search history.

(56) References Cited

U.S. PATENT DOCUMENTS

| | | | |
|---|---|---|---|
| 5,402,407 A | 3/1995 | Eguchi et al. | |
| 6,256,437 B1 * | 7/2001 | Sakushima | G02B 6/4224 385/147 |
| 7,899,105 B1 * | 3/2011 | Hargis | H01S 5/146 372/102 |
| 2012/0201259 A1 * | 8/2012 | Watanabe | B82Y 20/00 372/36 |

(Continued)

FOREIGN PATENT DOCUMENTS

| | | |
|---|---|---|
| JP | 06-005989 A | 1/1994 |
| JP | H10-41636 A | 2/1998 |
| JP | 2002-267893 A | 9/2002 |

(Continued)

*Primary Examiner* — Armando Rodriguez
(74) *Attorney, Agent, or Firm* — Global IP Counselors, LLP

(57) ABSTRACT

A method for manufacturing a light-emitting device includes: providing a base including a first depressed portion and a second depressed portion both upwardly opening; and positioning and mounting at least one semiconductor laser element on or above the base based on a predetermined point on a line connecting the first depressed portion and the second depressed portion in a plan view.

19 Claims, 11 Drawing Sheets

(56) References Cited

U.S. PATENT DOCUMENTS

2013/0329397 A1  12/2013  Shimizu et al.

FOREIGN PATENT DOCUMENTS

| JP | 2002-353382 A | 12/2002 |
| JP | 2003-031600 A | 1/2003 |
| JP | 2003-347648 A | 12/2003 |
| JP | 2008-015036 A | 1/2008 |
| JP | 2009-059853 A | 3/2009 |
| JP | 2009-081225 A | 4/2009 |
| JP | 2010-283228 A | 12/2010 |
| JP | 2013-254889 A | 12/2013 |
| JP | 2014-060218 A | 4/2014 |

* cited by examiner

METHOD FOR MANUFACTURING LIGHT-EMITTING DEVICE, METHOD FOR MANUFACTURING LASER MODULE, AND LIGHT-EMITTING DEVICE

CROSS-REFERENCE TO RELATED APPLICATION

This application claims priority to Japanese Patent Application No. 2016-090767, filed on Apr. 28, 2016, the disclosure of which is hereby incorporated by reference in its entirety.

BACKGROUND

The present disclosure relates to a method for manufacturing a light-emitting device, a method for manufacturing a laser module, and the light-emitting device.

Conventionally proposed light-emitting devices include laser elements mounted in packages that include caps, wavelength conversion members, and pedestals. To mount predetermined members in such light-emitting devices, the centers of the packages may be detected by image-recognizing the outer shapes of the packages from above such that the predetermined members is disposed at appropriate positions.

SUMMARY

In some cases, however, the outer shapes of the packages cannot be recognized clearly, and detection precision of the centers is decreased, which results in mispositioning of components such as the laser elements to be mounted in the light-emitting devices.

Also, when the resulting light-emitting devices are to be incorporated into modules or the like, positioning jigs are usually brought into contact with lateral surfaces of the packages but the lateral surfaces of the packages may be inclined. For this reason, positioning precision may change depending on whether contact positions of the positioning jigs on the lateral surfaces of the packages are nearer the upper surfaces or nearer the lower surfaces.

In view of the above, the present disclosure has an object to provide a light-emitting device in which alignment of a light emitting point or the like can be precisely performed, a method for manufacturing the light-emitting device, and a method for manufacturing a laser module.

The present application includes the following aspects.

(1) A method for manufacturing a light-emitting device includes: providing a base including a first depressed portion and a second depressed portion both upwardly opening; and positioning and mounting at least one semiconductor laser element on or above the base based on a predetermined point on a line connecting the first depressed portion and the second depressed portion in a plan view.

(2) A method for manufacturing a laser module including the light-emitting device manufactured by the above mentioned method includes: disposing the light-emitting device on a heat dissipation member; and clamping the light-emitting device between the heat dissipation member and an attachment at a position determined by aligning the light-emitting device with respect to the attachment by respectively inserting positioning members of the attachment into the first depressed portion and the second depressed portion of the light-emitting device.

(3) A light-emitting device includes: a base including a first depressed portion and a second depressed portion both upwardly opening; at least one semiconductor laser element disposed on or above the base; a lid joined to the base to enclose the at least one semiconductor laser element and upwardly transmit light from the at least one semiconductor laser element. The lid is disposed between the first depressed portion and the second depressed portion in a plan view. A light emitting point of the light-emitting device is located at a position overlapping a predetermined point on a line connecting the first depressed portion and the second depressed portion or at a position a predetermined distance away from the predetermined point in a plan view.

With the present disclosure, a light-emitting device including at least one semiconductor laser element in which alignment of a light emitting point or the like can be precisely performed, a method for manufacturing the light-emitting device, and a method for manufacturing a laser module can be provided.

DETAILED DESCRIPTION OF EMBODIMENTS

Figure 1:
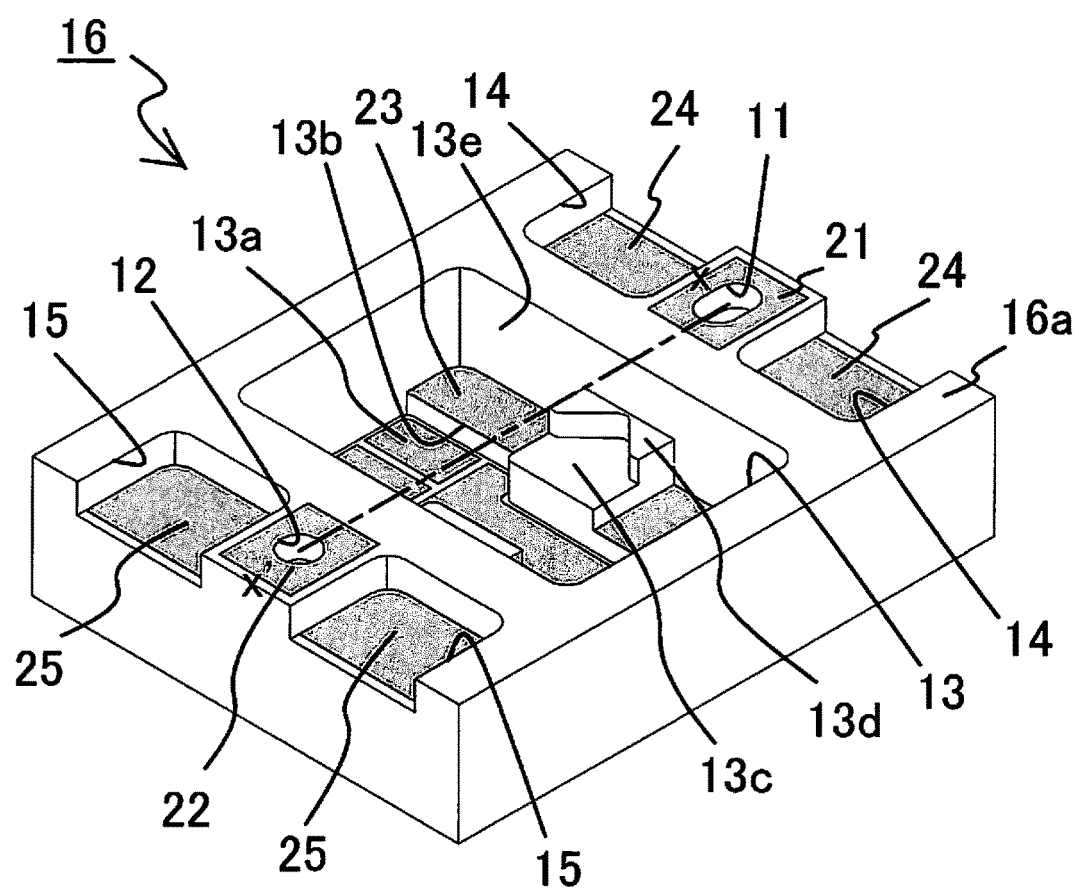
FIG. 1 is a schematic perspective view of a base used in a method for manufacturing a light-emitting device according to a first embodiment.

The embodiments below are examples intended to embody the technical concept of the present invention and are not intended to limit the present invention to these embodiments. It is noted that there is a case where magnitudes or positional relations of members illustrated in the drawings are exaggerated in order to clarify the descriptions. In addition, the same term or reference numeral generally represents the same member or a member made of the same material, and its repetitive description will be omitted as appropriate.

First Embodiment: Method for Manufacturing Light-Emitting Device

A method for manufacturing a light-emitting device according to the present embodiment includes: providing at least one semiconductor laser element and a base 16 having a first depressed portion 11 and a second depressed portion 12 both upwardly opening as shown in FIG. 1; and positioning and mounting the semiconductor laser element on or above the base 16 on the basis of a predetermined point on a line (represented by the dot-dash line x-x' in FIG. 1) connecting the first depressed portion 11 and the second depressed portion 12 in a plan view.

Providing Semiconductor Laser Element

Examples of the semiconductor laser element include elements including layers of semiconductors such as nitride semiconductors typically represented by the general formula $In_xAl_yGa_{1-x-y}N$, ($0 \leq x$, $0 \leq y$, $x+y \leq 1$), InAlGaAs-based semiconductors, and InAlGaP-based semiconductors. The emission wavelength of the semiconductor laser element can be adjusted by adjusting these materials and their compositions. An example of a semiconductor laser element include one having a emission wavelength in a range of 400 nm to 530 nm. When a YAG fluorescent material is combined, a semiconductor laser element preferably have an emission wavelength in a range of 420 nm to 490 nm.

Providing Base 16

The semiconductor laser element can be mounted on or above the base 16. For example, the base 16 can be formed of a metal, a resin, glass, or a ceramic. When a semiconductor laser element including a nitride semiconductor layer is used, the base 16 is preferably formed of a material other than resins because resins easily collect dust. In particular, in view of corrosion resistance, heat dissipation performance, and the like of the base 16, the base 16 preferably contains a ceramic, more preferably includes a portion formed of a ceramic as a main part. Examples of the ceramic include aluminum nitride and aluminum oxide. In particular, aluminum nitride is preferable because its heat dissipation performance and corrosion resistance are good. Examples of the shape in a plan view of the base 16 include various shapes such as approximate circles, approximate ellipses, and approximate polygons. For example, the shape in a plan view of the base 16 is an approximate rectangle. The term "in a plan view" means that the base 16 is observed from above where an upper surface 16a is the upper side and the bottom surface opposite to the upper surface 16a is the lower side, that is, observed approximately perpendicularly to the upper surface 16a. The shape in a plan view means the shape of the outer edge in a plan view.

The base 16 has the first depressed portion 11 and the second depressed portion 12 both upwardly opening. For example, the first depressed portion 11 and the second depressed portion 12 are formed continuously with the upper surface 16a of the base 16. Herein, the upper surface 16a of the base 16 is the uppermost surface among a plurality of surfaces of the base 16. The first depressed portion 11 and the second depressed portion 12 are used as marks for alignment used for mounting the semiconductor laser element on or above the base 16 in assembling the light-emitting device. Also, the first depressed portion 11 and the second depressed portion 12 can be used for alignment with a member other than the light-emitting device when a laser module of the light-emitting device is to be assembled.

The first depressed portion 11 and the second depressed portion 12 are preferably formed near two sides opposite to each other of the base 16 in a plan view, respectively. When the base 16 includes a ceramic portion formed of a ceramic, the first depressed portion 11 and the second depressed portion 12 are formed on the ceramic portion. As described later, forming the first depressed portion 11 and the second depressed portion 12 that do not penetrate through the base 16 can reduce misalignment of holes between a plurality of stacked ceramic layers.

The first depressed portion 11 and the second depressed portion 12 may have various shapes in a plan view such as approximate circles, approximate ellipses, and approximate polygons. The first depressed portion 11 and the second depressed portion 12 preferably have approximately circular or approximately oval shapes in a plan view when used as holes for alignment described later. This structure enables members for alignment to be inserted into the first depressed portion 11 and the second depressed portion 12 even when the members for alignment are out of alignment at some angle. The first depressed portion 11 and the second depressed portion 12 may have the same shape but preferably have different shapes in a plan view. For example, in a plan view, the first depressed portion 11 preferably has a shape longer than the second depressed portion 12, in particular, longer than the second depressed portion 12 in a direction along the line (i.e., line x-x') connecting the first depressed portion 11 and the second depressed portion 12. Specifically, the second depressed portion 12 preferably has an approximately circular shape, and the first depressed portion 11 preferably has an approximately ellipse or approximately oval shape, in a plan view. This structure allows for stable contact between positioning members described later and the first and second depressed portions 11 and 12, respectively, when the positioning members have tip portions with hemispherical curved shapes. The first depressed portion 11 having an approximately ellipse or approximately oval shape in a plan view enables the positioning members to be more certainly inserted into respective depressed portions even when the distance between the first depressed portion 11 and the second depressed portion 12 is changed by variation in dimensions due to dimensional tolerance.

It is preferable that the first depressed portion 11 and the second depressed portion 12 be not penetrate through the base 16. When the base includes a ceramic as a main component as described above, the base is manufactured by stacking a plurality of ceramic green sheets and sintering the layered workpiece. Thus, misalignment of holes between the layers can be reduced if the holes are formed only in some surface-side layer (for example, one or two layers) of the layered structure of the green sheets. Accordingly, the first depressed portion 11 and the second depressed portion 12 can be precisely formed, and image recognition of the first depressed portion 11 and the second depressed portion 12 can be performed easily and precisely. Thus, positioning or other manufacturing step of the light emitting point in the light-emitting device can be performed precisely. In addition, since the first depressed portion 11 and the second depressed portion 12 are not through holes but depressed portions, the bottom surface area of the base 16 is not readily reduced. By connecting the bottom surface of the base 16 to a heat dissipation member, heat from components such as the semiconductor laser element can be dissipated. Therefore, discouraging reduction in the bottom surface area of the base 16 can ensure a larger area that contributes to heat dissipation. Accordingly, the heat dissipation performance can be improved. Each depth of the first depressed portion 11 and the second depressed portion 12 can be, for example, 0.2 mm or more. The depths of the first depressed portion 11 and the second depressed portion 12 are at most in a range in which through holes are not formed. For example, the depths can be equal to or less than the maximum width of the second depressed portion 12 and may be equal to or less than half the maximum width.

Preferably, a first metal layer 21 and a second metal layer 22 are respectively disposed around the first depressed portion 11 and the second depressed portion 12 in a plan view. The first metal layer 21 is adjacent to the first depressed portion 11, and the second metal layer 22 is adjacent to the second depressed portion 12. These metal layers facilitate image recognition of the first depressed portion 11 and the second depressed portion 12 in the manufacturing procedure of the light-emitting device. This is because disposing the first metal layer 21 and the second metal layer 22 that are different in color tones from the ceramic portion or the like of the base 16 presents a high contrast. Since the first metal layer 21 and the second metal layer 22 are disposed adjacent respectively to the first depressed portion 11 and the second depressed portion 12, inner edges of the first metal layer 21 and the second metal layer 22 are located at approximately the same positions as respective outer edges of the first depressed portion 11 and the second depressed portion 12. Accordingly, a high contrast between the inside and the outside of the first depressed portion 11 and the second depressed portion 12 is presented, which facilitates the image recognition. Thus, in this case, the inner edges of the first metal layer 21 and the second metal layer 22 are first identified by image recognition, and the line connecting the first depressed portion 11 and the second depressed portion 12 can be determined using the identified inner edges of the first metal layer 21 and the second metal layer 22. The first metal layer 21 and the second metal layer 22 can be formed of, for example, equal to or more than one of copper, gold, silver, aluminum, titanium, platinum, nickel, palladium, tungsten, molybdenum, and an alloy of these. For example, gold is mainly used for the uppermost layers of the first metal layer 21 and the second metal layer 22. This structure can present a high contrast to the ceramic portion of the base 16. In the base 16, the first metal layer 21 and the second metal layer 22 are formed on the upper surface 16a of the base 16.

The base 16 can further have a third depressed portion 13 that is upwardly opening and located between the first depressed portion 11 and the second depressed portion 12. The third depressed portion 13 includes, for example, a bottom surface 13a, connecting surfaces 13b, member placement surfaces 13c, projections 13d, and lateral surfaces 13e. The opening of the third depressed portion 13 is usually larger than the openings of the first depressed portion 11 and the second depressed portion 12 because components such as the semiconductor laser element are disposed in the third depressed portion 13.

The bottom surface 13a is a surface on which components such as the semiconductor laser element are disposed. The bottom surface 13a is at the deepest position in the third depressed portion 13. The bottom surface 13a is preferably parallel to the upper surface 16a of the base 16.

The connecting surfaces 13b are formed on or above the bottom surface 13a. Wiring layers 23 are disposed on the upper surfaces of the connecting surfaces 13b, such that the connecting surfaces 13b are used for electrical connection to the semiconductor laser element. The connecting surfaces 13b are preferably located on both sides of the bottom surface 13a in a plan view. This structure allows an anode-side wiring layer 23 and a cathode-side wiring layer 23 to be disposed near the semiconductor laser element. The semiconductor laser element can be thus easily connected to the wiring layers 23 with wires. The connecting surfaces 13b can be located below the member placement surfaces 13c described later. With this structure, the wires are less likely to be in contact with the member even if the wires are disposed at positions overlapping the member disposed on the member placement surfaces 13c in a plan view. Preferably, the connecting surfaces 13b are substantially parallel to the bottom surface 13a. The wiring layers 23 can be formed of, for example, one or more substances selected from the group consisting copper, gold, silver, aluminum, titanium, platinum, nickel, palladium, tungsten, molybdenum, and an alloy of these. The wiring layers 23 can be formed of the same material as for the first metal layer 21 and the second metal layer 22 described above. This structure enables the wiring layers 23 to be formed in a step similar to a step of forming the first metal layer 21 and the second metal layer 22.

The connecting surfaces 13b are preferably about the same height as the upper surface of the semiconductor laser element disposed on the bottom surface 13a. This structure can reduce the lengths of the wires, and thus can reduce electrical resistance of the wires. Also, connection to the semiconductor laser element with the wires can be facilitated.

The member placement surfaces 13c are formed on or above the connecting surfaces 13b. In the case of disposing a later described member for reflecting, converting, and/or diffusing light from the semiconductor laser element, the member is disposed on the member placement surfaces 13c. The member placement surfaces 13c are preferably parallel to the bottom surface 13a.

The projections 13d can be optionally disposed and located at a position higher than the connecting surfaces 13b and the member placement surfaces 13c, and protruding toward the inside of the third depressed portion 13. The projections 13d are adjacent to the member placement surfaces 13c. In the case of disposing the member for reflecting, converting, and/or diffusing laser light, the projections 13d can be used as a stopper to stop mispositioning to some extent even if the member is delaminated from the member placement surfaces 13c. The projections 13d may be used for aligning or fixing the member.

The bottom surface 13a, the connecting surfaces 13b, the member placement surfaces 13c, and the projections 13d are preferably located in different regions in a plan view.

The lateral surfaces 13e extend from the bottom surface 13a, the connecting surfaces 13b, and the projections 13d to the upper surface 16a of the base 16. Part of the upper surface 16a of the base 16 around the outer periphery of the third depressed portion 13 is used for supporting a lid 17 described later and for sealing the semiconductor laser element.

When the base 16 has an approximately quadrilateral shape in a plan view, the third depressed portion 13 has, for example, an approximately quadrilateral shape or an approximately quadrilateral shape having rounded corners in a plan view. In this case, the bottom surface 13a, the connecting surfaces 13b, and the member placement surfaces 13c can have approximately polygonal shapes or approximately polygonal shapes having rounded corners in a plan view.

The base 16 includes external electrodes 24 and 25. Either the external electrodes 24 or the external electrodes 25 are anode electrodes, and the others are cathode electrodes. The external electrodes 24 and 25 may be each electrically connected to the near wiring layer 23 via an inner-layer wiring disposed inside the base 16.

The base 16 may further have fourth depressed portions 14 and fifth depressed portions 15 on which the external electrodes 24 and 25 are disposed. It is preferable that the fourth depressed portions 14 and the fifth depressed portions 15 be respectively disposed near the first depressed portion 11 and the second depressed portion 12, more preferably on both sides of the first depressed portion 11 and the second depressed portion 12. This structure can reduce the distance between the wiring layers 23 on the upper surfaces of the connecting surfaces 13b and the external electrodes 24 and 25, thereby enabling reduction of the lengths of the inner-layer wirings connecting them. Wiring resistance can be thus reduced.

The fourth depressed portions 14 and the fifth depressed portions 15 are preferably disposed independently of the third depressed portion 13. This structure enables the lid 17 to be joined to a region between the fourth and fifth depressed portions 14 and 15 and the third depressed portion 13, such that the external electrodes 24 and 25 are less likely to be in contact with the lid 17 even in the case of mounting misalignment of the lid 17. Accordingly, even when the lid 17 includes an electrically-conductive holding member as described later, short-circuiting is less likely to occur between the external electrodes 24 and the external electrodes 25 connected via the holding member.

The bottom surfaces of the fourth depressed portions 14 and the fifth depressed portions 15 are lower than the upper surface of the base. For example, the bottom surfaces of the fourth depressed portions 14 and the fifth depressed portions 15 are located above the connecting surfaces 13b.

The external electrodes 24 and 25 having sizes that fit inside the bottom surfaces of the fourth depressed portions 14 and the fifth depressed portions 15 are formed on these bottom surfaces. The external electrodes 24 and 25 can be formed of, for example, one or more substances selected from the group consisting of copper, gold, silver, aluminum, titanium, platinum, nickel, palladium, tungsten, molybdenum, and an alloy of these. A material different from the material of the wiring layers 23 can be used, but the same material is preferable because a similar step can be employed. The external electrodes 24 and 25 can be formed respectively on the bottom surfaces of the first depressed portion 11 and the second depressed portion 12. In this case, the positioning members described later also serve as power supply members and have contact with the external electrodes 24 and 25.

Disposing the external electrodes 24 and 25 on the upper side of the base 16 as described above eliminates the need for disposing electrodes on the lower surface of the base 16. Thus, approximately the entire lower surface of the base 16 can serve as a heat dissipation surface, and heat dissipation performance can be improved. In this case, the lower surface of the base 16 may be thermally connected to a heat dissipation member such as a heatsink directly or via grease or the like.

This base 16 tends to have a large thickness because the third depressed portion 13 is formed. In other words, the thickness of the base 16 tends to increase because there is a need for ensuring a thickness of the base 16 enough for the third depressed portion 13 to be formed. For example, the base 16 is formed by stacking about five to ten ceramic green sheets. Thus, it has a large advantage to form the first depressed portion 11 and the second depressed portion 12 not as through holes but as depressed portions. This is because misalignment of holes between the layers can be reduced by employing depressed portions.

Mounting Semiconductor Laser Element

Figure 2A:
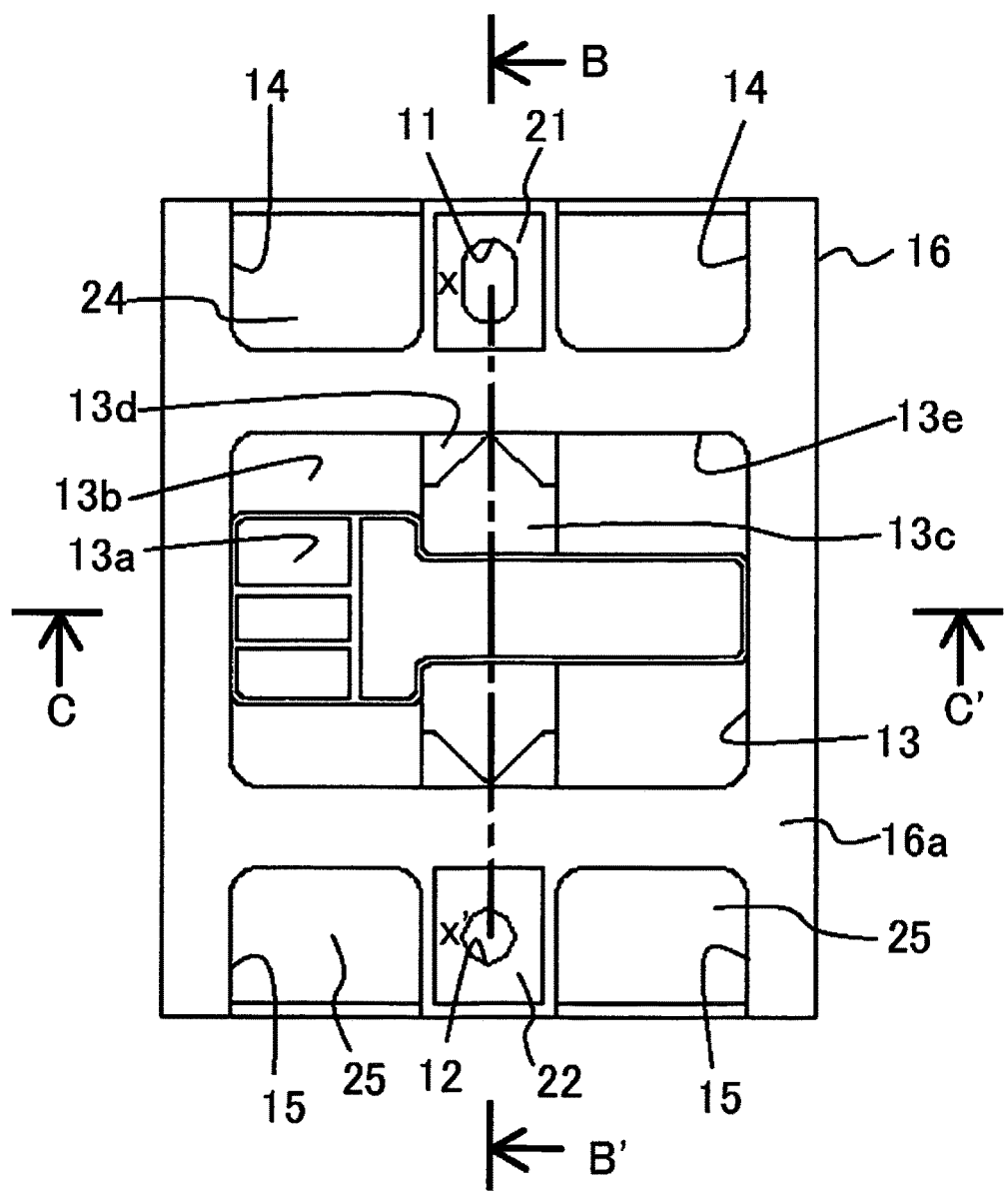
FIG. 2A is a schematic plan view of the base in FIG. 1.
Figure 2B:
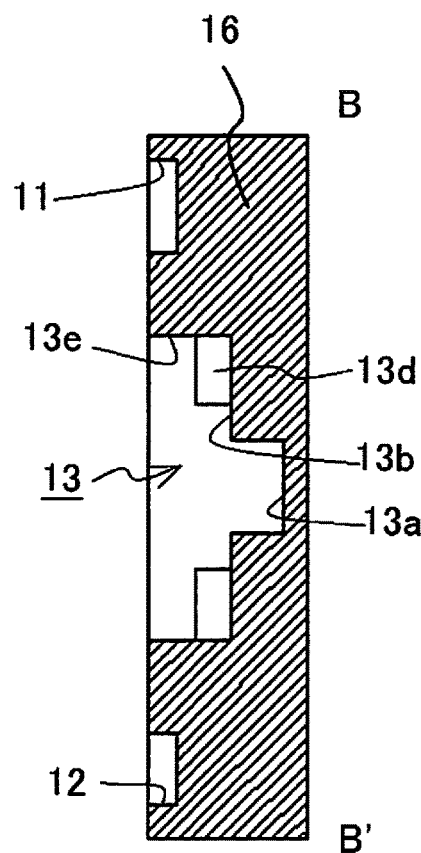
FIG. 2B is a schematic cross-sectional view along the line B-B' in FIG. 2A.
Figure 2C:
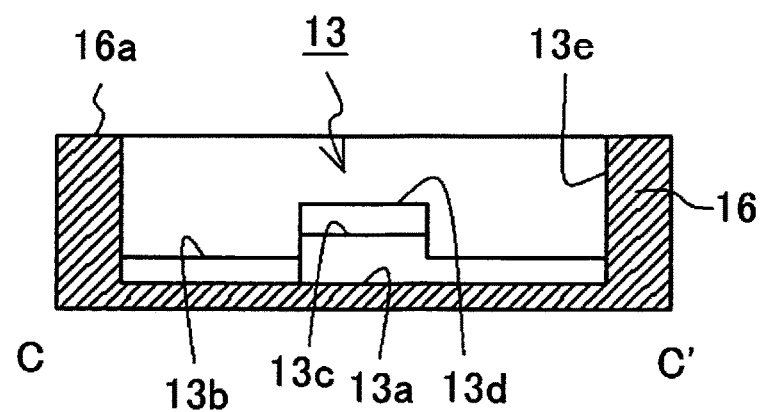
FIG. 2C is a schematic cross-sectional view along the line C-C' in FIG. 2A.
Figure 2D:
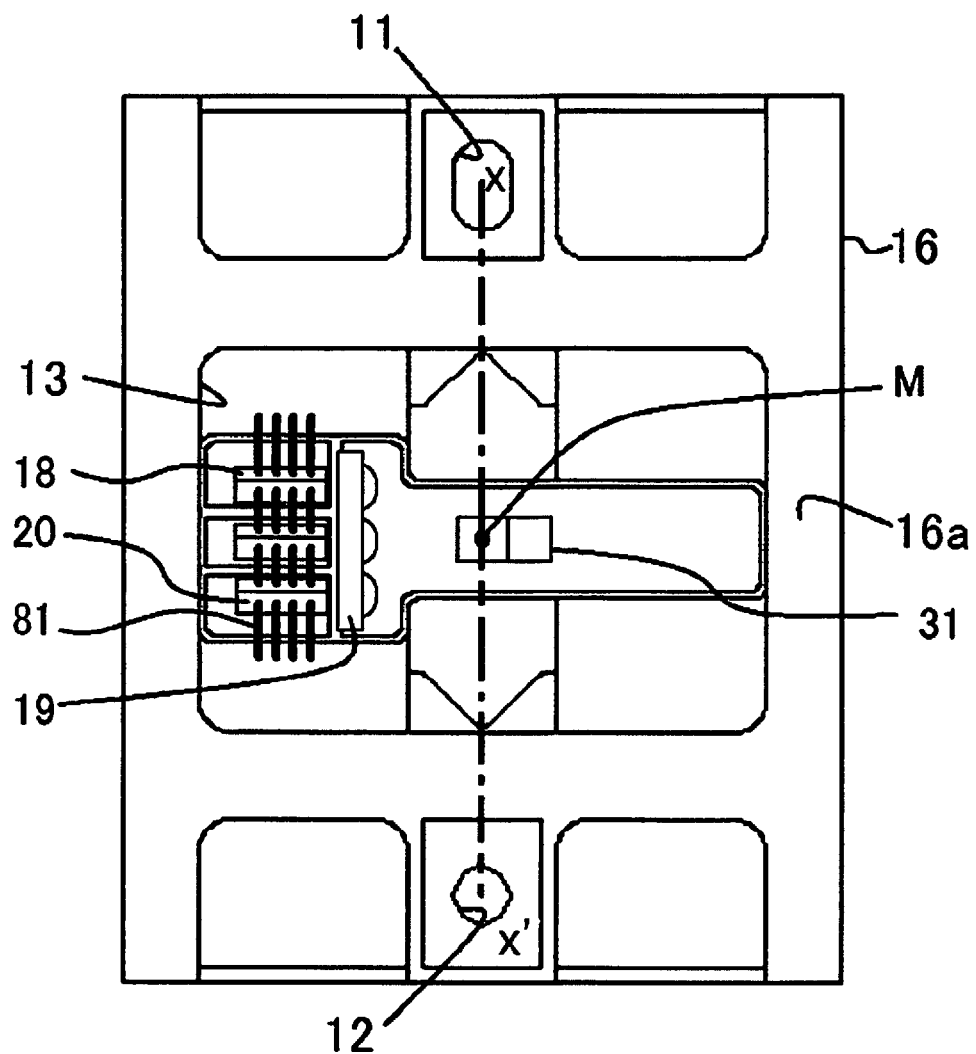
FIG. 2D is a schematic plan view for illustrating a step in the method for manufacturing a light-emitting device using the base in FIG. 1.

After providing the at least one semiconductor laser element and the base 16, as shown in FIG. 2D, the at least one semiconductor laser element is positioned and mounted on the base 16 on the basis of the predetermined point on the line (line x-x') connecting the first depressed portion 11 and the second depressed portion 12 in a plan view. Positional information (for example, plane coordinates represented in the X and Y directions) for disposing components such as the semiconductor laser element can be determined not by using either one of the first depressed portion 11 and the second depressed portion 12 but using the predetermined point on the line (line x-x') connecting the first depressed portion 11 and the second depressed portion 12 as a reference point.

To perform this determination, the X and Y coordinates of the predetermined point (i.e., reference point) and the mounting positions of components such as the semiconductor laser element are selected in advance in a design drawing or the like. For example, a direction perpendicular to the line x-x' connecting the first depressed portion 11 and the second depressed portion 12 is regarded as the X direction, a direction parallel to the line x-x' is regarded as the Y direction, and the X and Y coordinates of each of the reference point and the mounting positions of components such as the semiconductor laser element are selected in advance. The X and Y coordinates of the reference point are set to, for example, (0,0).

Subsequently, the shapes of the first depressed portion 11 and the second depressed portion 12 are recognized in a plan view using the actual base 16. In the manufacturing procedure of the light-emitting device, such shapes can be usually identified using an image recognition program or the like by automatically processing an image captured by a camera. After identifying the shapes of the first depressed portion 11 and the second depressed portion 12 by image recognition, their centers of gravity (or the centers in the case of circles) are each determined on the basis of their outer edges, and a line connecting these centers of gravity is defined. This line is preferably defined as the line connecting the first depressed portion 11 and the second depressed portion 12. This procedure can determine the reference point more precisely. That is, the outer edges of the first depressed portion 11 and the second depressed portion 12 may form shapes somewhat different from the shapes in the design drawing, and in such a case, a line connecting the outer edges of the first depressed portion 11 and the second depressed portion 12 tends to largely deviate from the corresponding line in the design drawing. Even in such a case, the centers of gravity determined from the outer edges are less likely to deviate from the centers of gravity in the design drawing. Thus, the reference point can be more precisely determined by using the line connecting the centers of gravity determined from the outer edges.

The predetermined point used as the reference point is, for example, the midpoint M of the line connecting the first depressed portion 11 and the second depressed portion 12. A formula for calculating the midpoint may be included in a die bonder as standard. Using such a machine eliminates the need for adding a new formula to determine the midpoint, in other words, the predetermined point.

Subsequently, the X and Y coordinates that have been selected in advance are applied to the actual base 16 on the basis of the predetermined point. This procedure identifies the mounting positions of components such as the semiconductor laser element in the actual base 16. The X direction and the Y direction of the actual base 16 may be identified such that, for example, a direction perpendicular to the line x-x' connecting the first depressed portion 11 and the second depressed portion 12 is the X direction, and a direction parallel to the line x-x' is the Y direction. After that, components such as the semiconductor laser element are disposed at their mounting positions on the base 16 on the basis of the X and Y coordinates applied to the actual base 16.

Figure 2E:
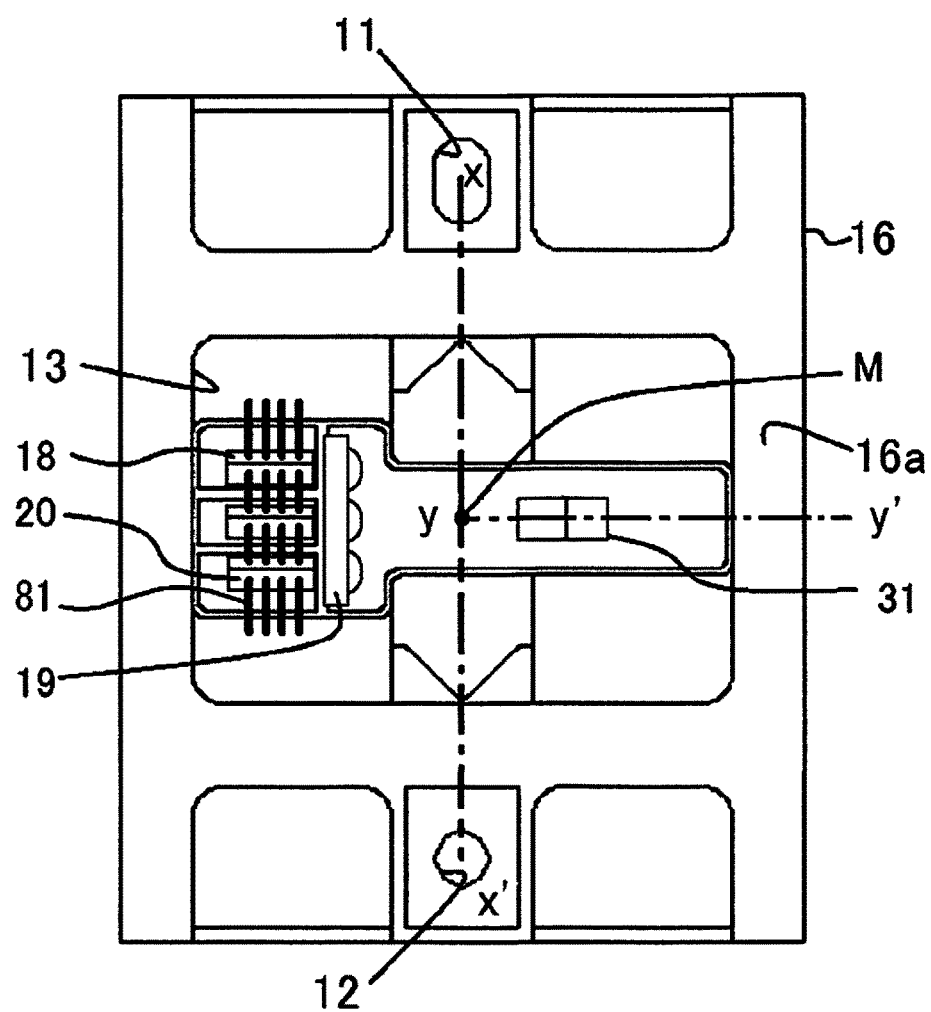
FIG. 2E is a schematic plan view for illustrating another step in the method for manufacturing a light-emitting device using the base in FIG. 1.

The light emitting point may be located at the position of the predetermined point, which is the reference point, but the light emitting point can be located at a position different from the predetermined point. That is, the light emitting point may be located at a position (i.e., second predetermined point) away from the predetermined point at a predetermined distance. As shown in FIG. 2E, the second predetermined point is located on, for example, a line y-y' extending perpendicularly to the line x-x' connecting the first depressed portion 11 and the second depressed portion 12 from the predetermined point. In this case, if the predetermined point is the midpoint, the second predetermined point is located on the perpendicular bisector of the line connecting the first depressed portion 11 and the second depressed portion 12. In this case also, effects can be obtained that is similar in the case where the predetermined point coincides with the light emitting point. That is, the second predetermined point can be identified using the first depressed portion 11 and the second depressed portion 12 in a resulting module, and thus the second predetermined point (i.e., the light emitting point) can be precisely estimated without light emission from the light-emitting device. A light exit point or the light emitting point herein means a point at which light from the light-emitting device is emitted at the maximum intensity or a region near this point, in a plan view as seen from the light extraction side.

The semiconductor laser element can be disposed away from the light exit point in a plan view, and a light exit member that changes the direction of light from the semiconductor laser element can be disposed at the light exit point. Preferably, components such as the semiconductor laser element are positioned and mounted, such that light exits from the semiconductor laser element toward the light exit member, is reflected by the light exits member, and exits from the light exits member as the light emitting point. With this arrangement, an edge-emitting semiconductor laser element can be mounted such that its main surface is approximately parallel to the lower surface of the base 16 in a light-emitting device in which the upper surface is the light-extracting surface. This structure can improve the heat dissipation efficiency of the semiconductor laser element and allows for use of a high-power laser element that can carry a larger current.

This light exit member may be, for example, a wavelength conversion member that converts the wavelength of light from the semiconductor laser element, a light-transmissive member containing a light-diffusion material that scatters the light from the semiconductor laser element, a light-reflective member that reflects the light from the semiconductor laser element, or a member that bends the light from the semiconductor laser element. In particular, the light exit member is preferably the wavelength conversion member and/or the light-reflective member. With the wavelength conversion member used as the light exit member, the light-emitting device can emit light having a color different from the color of laser light emitted from the semiconductor laser element. With the light-reflective member used as the light exit member, the direction of light from the semiconductor laser element can be efficiently changed. The light exit member is preferably disposed on the basis of the predetermined point being a reference such that light is emitted upward with respect to the base 16. More preferably, the semiconductor laser element and the light exit member are positioned and mounted such that light is emitted in a direction approximately perpendicular to a plane including the upper surface 16a of the base 16.

The semiconductor laser element is mounted on the base 16, particularly preferably mounted on the bottom surface 13a, in a such a manner as to be housed in the third depressed portion 13 of the base 16. This structure facilitates airtightly sealing the semiconductor laser element by joining the lid 17 to the base 16. When mounting the semiconductor laser element, the semiconductor laser element may be directly disposed on the bottom surface 13a of the third depressed portion 13, but is preferably disposed on the bottom surface 13a via a submount 18. This structure can separate the light-emission surface of the semiconductor laser element from the bottom surface 13a and can discourage the bottom surface 13a from being exposed to light from the semiconductor laser element. As the submount 18, for example, silicon carbide or aluminum nitride can be used. Preferably, the semiconductor laser element is mounted such that emitted light travels in a direction substantially parallel to the bottom surface 13a, in other words, the optical axis of emitted laser light becomes substantially parallel to the bottom surface 13a. For example, an edge-emitting type employed for a semiconductor laser element is mounted such that the main surface of an active layer included in the semiconductor laser element becomes substantially parallel to the bottom surface 13a.

After mounting the semiconductor laser element on or above the base 16, for example, on the bottom surface 13a of the third depressed portion 13, it is preferable that an optical member be further positioned and mounted on the bottom surface 13a of the third depressed portion 13. Examples of the optical member include a lens 19 and a prism.

Positioning of the lens 19 may be performed on the basis of the above predetermined point, but the lens 19 is preferably positioned and mounted with the semiconductor laser element mounted on the base 16 actually emitting light. That is, the lens 19 is temporarily disposed on the optical path of laser light actually emitted from the semiconductor laser element, the position of the lens 19 is adjusted while checking the position of the laser light that has passed through the lens 19, and the mounting position is identified such that the laser light reaches a predetermined position through the optical member. Such a mounting position is selected such that, for example, light that has been transmitted through the lens 19 is exited from the predetermined point in a plan view through the light exit member. The lens 19 may be then mounted at the mounting position identified.

By positioning and mounting the semiconductor laser element on or above the base 16 on the basis of the predetermined point on the line connecting the first depressed portion 11 and the second depressed portion 12 as described above, more precise mounting can be achieved than in the case of positioning the semiconductor laser element on the basis of the outer shape of the base 16 or the like.

In particular, if the same first and second depressed portions 11 and 12 are used as a reference in fix each components in a manufacturing procedure of a module described later, the light emitting point in the module can be accurately identified, which is advantageous. This is because mispositioning is less likely to occur since the same first and second depressed portions 11 and 12 are used in identification of the reference point to mount components such as the semiconductor laser element and used in alignment for fixing the light-emitting device to another member.

For example, the center of the base 16 coincides with or is located near the light emitting point in a plan view. When the light emitting point is located away from the center of the base 16 in a plan view, the light emitting point of the light-emitting device is located so as not to be blocked by an attachment when the laser module described later is manufactured.

In particular, a ceramic package has advantages such as high design flexibility, which enhances wiring design flexibility. For example, the electrodes can be disposed on the upper side, such that the entire lower surface can be used as a heat dissipation surface. In contrast, since the package is manufactured by stacking a plurality of ceramic layers (e.g., green sheets) and sintering the layered workpiece, there is the problem that the outer shapes of packages vary because of misalignment between the layers, shrinkage in size by the sintering, or other disadvantage during manufacture. Even when the ceramic package is used, the present embodiment can realize precise positioning by using the first depressed portion 11 and the second depressed portion 12 for positioning the light emitting point regardless of such variation in outer shape.

Second Embodiment: Light-Emitting Device

Figure 3A:
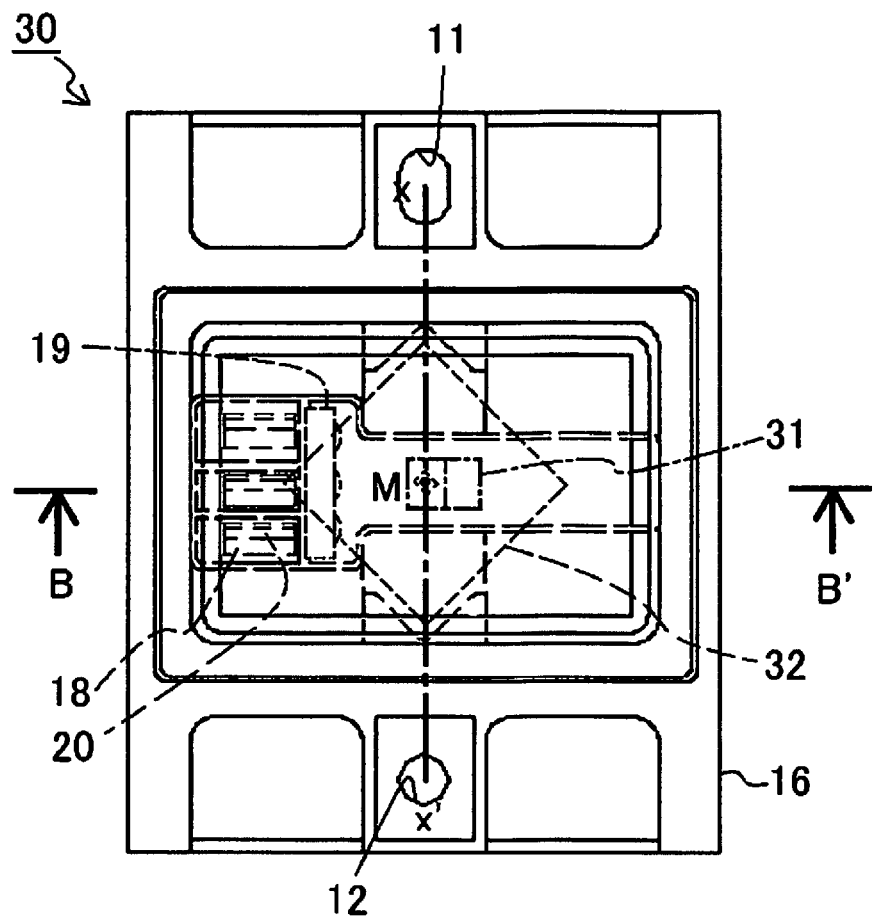
FIG. 3A is a schematic perspective view of a light-emitting device according to a second embodiment.
Figure 3B:
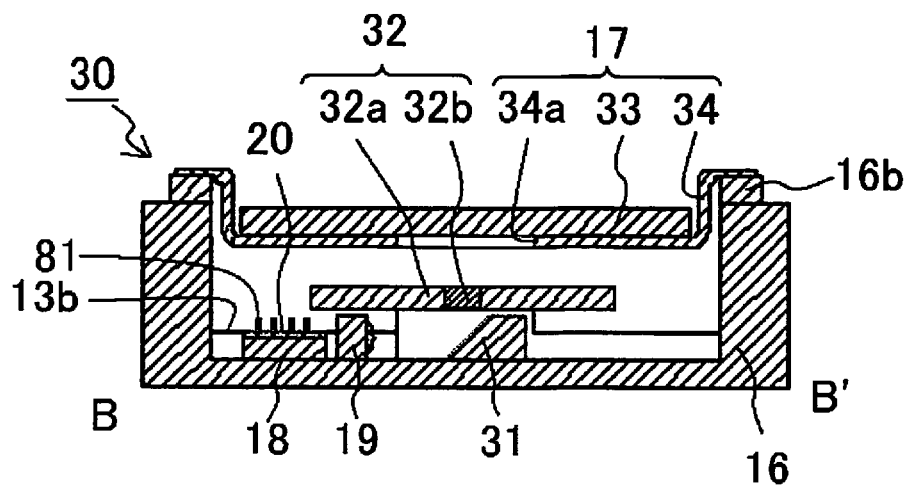
FIG. 3B is a schematic cross-sectional view along the line B-B' in FIG. 3A.

A light-emitting device 30 according to the present embodiment includes, as shown in FIGS. 3A and 3B, the above-mentioned base 16, at least one semiconductor laser element 20 disposed on or above the base 16, and the lid 17 joined to the base 16 to seal the semiconductor laser element 20 and transmit light from the semiconductor laser element 20 upward. The light-emitting device 30 further includes light exit members (e.g., a light-reflective member 31 and a wavelength conversion member 32) and the lens 19.

As described above, the base 16 has an approximately quadrilateral outer shape in a plan view and has the first depressed portion 11 and the second depressed portion 12 on both ends. The predetermined point, preferably the midpoint M, on the line (line x-x') connecting the first depressed portion 11 and the second depressed portion 12 is the light emitting point.

The edge-emitting semiconductor laser element 20 is mounted on the bottom surface 13a of the third depressed portion 13 on the base 16 via the submount 18. The semiconductor laser element 20 is disposed such that the optical axis of its laser light is approximately perpendicular to the line x-x'. In a plan view, for example, the light-reflective member 31 and the wavelength conversion member 32 are disposed as the light exit members near the above predetermined point, preferably near the midpoint M. The light-reflective member 31 and the wavelength conversion member 32 may be disposed at the above second predetermined point in a plan view.

Light-Reflective Member 31

The light-reflective member 31 is disposed at a position on the bottom surface 13a of the third depressed portion 13 at which the light-reflective member 31 can reflect light from the semiconductor laser element 20. The light-reflective member 31 has a light-reflecting surface that reflects light from the semiconductor laser element 20 upward. The light-reflecting surface of the light-reflective member 31 is preferably disposed at a position overlapping the above predetermined point (preferably the midpoint M) in a plan view. The light emitting point is deemed to be at the position of the light-reflecting surface in a plan view. Thus, this arrangement allows the predetermined point to substantially coincide with the light emitting point.

The light-reflective member 31 can be a member made of optical glass having a shape such as a triangular prism and a frustum of a quadrangular pyramid that has a light-reflective film on its inclined surface. The angle between the bottom surface 13a and the inclined surface of the light-reflective member 31 is, for example, 30 to 60 degrees, preferably about 45 degrees. With this structure, light from the semiconductor laser element 20 that travels in a direction approximately parallel to the bottom surface 13a can be directed to a direction approximately perpendicular to the bottom surface 13a.

The number of the light-reflective member 31 disposed in one light-emitting device may be one or more. When a plurality of semiconductor laser elements 20 are mounted in one light-emitting device, a plurality of light-reflective members 31 may be disposed.

Wavelength Conversion Member 32

The wavelength conversion member 32 converts the wavelength of light from the semiconductor laser element 20. The light from the semiconductor laser element 20 herein means light originating from the semiconductor laser element 20 and includes light reflected by the light-reflective member 31. The wavelength conversion member 32 is, for example, fixed to the member placement surfaces 13c in the third depressed portion 13. In a plan view, the light emitting point is deemed to be at the position of the wavelength conversion member 32 (in particular, a fluorescent-material-containing portion 32b).

The wavelength conversion member 32 includes the fluorescent-material-containing portion 32b. The wavelength conversion member 32 preferably includes a holding portion 32a having a through hole and the fluorescent-material-containing portion 32b disposed inside the through hole. This structure enables heat generated in the fluorescent-material-containing portion 32b to be efficiently released through the holding portion 32a.

A material having a high thermal conductivity is preferably used as the holding portion 32a in view of heat dissipation from the fluorescent-material-containing portion 32b. Examples of such a material include metals such as copper, copper alloys, and iron or iron alloys and ceramics such as aluminum nitride and aluminum oxide.

Preferably, the holding portion 32a can reflect and/or absorb laser light emitted from the semiconductor laser element 20. With this structure, the laser light can be reflected and/or absorbed by the holding portion 32a even when the wavelength conversion member 32 is detached from the member placement surfaces 13c and the wavelength conversion member 32 has become out of its appropriate position. Accordingly, the laser light is less likely to leak to the outside.

When the semiconductor laser element 20 is a laser element that collects dust, such as a GaN laser element, it is preferable that the fluorescent-material-containing portion 32b be made of an inorganic material in order to discourage dust collection. The fluorescent-material-containing portion 32b employs, for example, a sintered body made of or containing a fluorescent material.

The fluorescent material can be selected from known materials. For example, a material that can provide white light in combination with the semiconductor laser element 20 is selected. For example, when the semiconductor laser element 20 emits blue light, a fluorescent material can be one that uses light emitted from the semiconductor laser element 20 as excitation light to emit yellow light. Examples of the fluorescent material include YAG fluorescent materials as yellow-light-emitting fluorescent material.

The wavelength conversion member 32 may have a size enough to cover 60% or more of the area of the third depressed portion 13 in a plan view.

This constitution can reduce the risk that laser light emitted from the semiconductor laser element 20 is not transmitted through the wavelength conversion member 32 and leak out of the light-emitting device 30.

Lid 17

For example, the lid 17 covers the opening of the third depressed portion 13 and is joined to the base 16 so as to seal the semiconductor laser element 20 mounted in the third depressed portion 13. In this case, the lid 17 is preferably joined to the base 16 in such a manner as not to overlap the first depressed portion 11 and the second depressed portion 12 in a plan view. This structure allows the first depressed portion 11 and the second depressed portion 12 to be used for alignment in modularization described later. Specifically, the base 16 can have the first depressed portion 11 and the second depressed portion 12 upwardly opening respectively on portions that the lid 17 is clamped in a plan view. The lid 17 can be connected to the base 16 using, for example, a eutectic material. A metal frame 16b may be disposed on the upper surface of the base 16, and the lid 17 may be welded to the metal frame 16b as shown in FIG. 3B.

The lid 17 includes a light-transmissive member 33 that transmits, preferably upward, light from the semiconductor laser element 20. The light from the semiconductor laser element 20 herein means light originating from the semiconductor laser element 20. Thus, the light from the semiconductor laser element 20 includes not only laser light emitted from the semiconductor laser element 20 but also light after wavelength conversion emitted from the wavelength conversion member 32. The light-transmissive member 33 can be formed of glass or the like.

The lid 17 preferably includes a holding member 34 having a through hole 34a to hold the light-transmissive member 33. The opening area of the through hole 34a on the incident side is preferably larger than the area of the light emitting surface side of the fluorescent-material-containing portion 32b of the wavelength conversion member 32. The light-transmissive member 33 is disposed in such a manner as to cover the through hole 34a of the holding member 34 of the lid 17. The light-transmissive member 33 is preferably fixed inside the through hole 34a of the holding member 34 of the lid 17 or fixed to the surface of the holding member 34 of the lid 17 on the side opposite to the wavelength conversion member 32 side. Thus, the upper surface of the wavelength conversion member 32 can be positioned closer to the lower surface of the lid 17, thereby facilitating extraction of light from the wavelength conversion member 32 through the light-transmissive member 33. A metal such as KOVAR® can be used for the holding member 34.

When the lid 17 consists of the light-transmissive member 33 only, the lid 17 can be fixed to the base 16 with a eutectic material. When the lid 17 includes the light-transmissive member 33 and the holding member 34, the holding member 34 can be fixed to the base 16 by welding. Welding can achieve secure fixation of the light-transmissive member 33 to the base 16. Thus, in the resulting light-emitting device 30, the lid 17 is less likely to be detached from the base 16 even when the light-emitting device 30 is subjected to impact such as vibration.

When a light-emitting device having such a structure is manufactured, the semiconductor laser element can be positioned and mounted as in the first embodiment.

As described above, in the light-emitting device 30, components such as the semiconductor laser element 20 are positioned and mounted on or above the base 16 on the basis of the first depressed portion 11 and the second depressed portion 12, in particular, the predetermined point on the line connecting these depressed portions. Thus, components such as the semiconductor laser element 20 are more precisely mounted than when components such as the semiconductor laser element 20 are positioned on the basis of the outer shape of the base 16 or the like.

Third Embodiment: Light-Emitting Device

Figure 4:
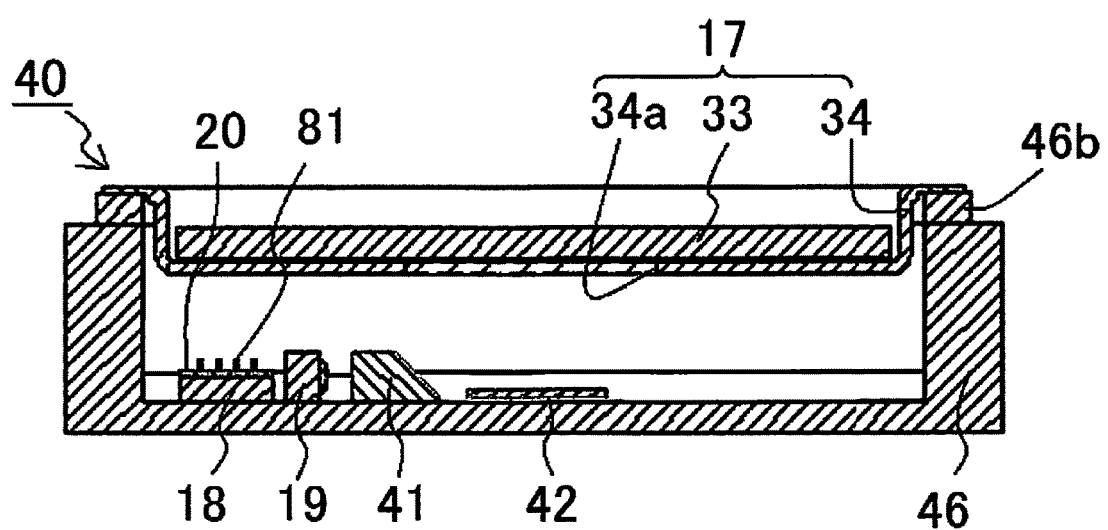
FIG. 4 is a schematic cross-sectional view of a light-emitting device according to a third embodiment.

As shown in FIG. 4, a light-emitting device 40 according to the present embodiment includes, a base 46, at least one semiconductor laser element 20 disposed on or above the base 46, and the lid 17 joined to the base 46 to seal the semiconductor laser element 20 and transmit light from the semiconductor laser element 20 upward.

The light-emitting device 40 further includes a light exit member (e.g., a wavelength conversion member 42), a prism 41, the lens 19, and the lid 17 that is welded to a metal frame 46b disposed on the upper surface of the base 46.

The base 46 used here may have substantially the same structure as the above base 16 except that the member placement surfaces 13c and the projections 13d do not exist.

The edge-emitting semiconductor laser element 20 is mounted on the bottom surface 13a of the third depressed portion 13 in the base 46 via the submount 18. The emission surface of the semiconductor laser element 20 is disposed in an orientation such that the optical axis of emitted laser light is approximately perpendicular to the line x-x'. In a plan view, for example, the wavelength conversion member 42 is disposed as the light exit member near the above predetermined point, preferably near the midpoint M. The wavelength conversion member 42 may be disposed at the above second predetermined point in a plan view. The lens 19 that converges light emitted from the semiconductor laser element 20 or turns the light into parallel light, and the prism 41 that refracts light from the lens 19 are disposed between the semiconductor laser element 20 and the wavelength conversion member 42.

Prism 41

The prism 41 is used as a member for refracting laser light emitted from the semiconductor laser element 20 to a direction toward the upper surface of the wavelength conversion member 42. The prism 41 is disposed at such a position on the bottom surface 13a of the third depressed portion 13 that light from the semiconductor laser element 20 can travel through the prism 41. Examples of the prism 41 include a member made of optical glass having a shape such as a triangular prism and a frustum of a quadrangular pyramid that has an inclined surface.

The number of the prism 41 disposed in one light-emitting device may be one or more. When a plurality of semiconductor laser elements 20 are mounted in one light-emitting device, a plurality of prisms 41 may be disposed.

Wavelength Conversion Member 42

The wavelength conversion member 42 converts the wavelength of light emitted from the prism 41. Since the upper surface of the wavelength conversion member 42 is irradiated with the light emitted from the prism 41, the upper surface of the wavelength conversion member 42 is the main emitting surface of the wavelength conversion member 42. The wavelength conversion member 42 is fixed to the bottom surface 13a in the third depressed portion 13 and is regarded as being disposed at a position overlapping the light emitting point in a plan view.

The wavelength conversion member 42 preferably has a plate-like shape. In this case, the wavelength conversion member 42 has the upper surface and the lower surface that are larger in area than any of its lateral surfaces. With this structure, light from the upper surface of the wavelength conversion member 42 can be more intense than the light from its lateral surfaces, thereby enabling achievement of higher output of the light-emitting device. Also, the lower surface having a large area as the mounting surface can facilitate efficient dissipation of heat generated in the wavelength conversion member 42. When the semiconductor laser element 20 is a laser element that collects dust, such as a GaN-based laser element, it is preferable that the wavelength conversion member 42 be made of an inorganic material. This structure can discourage dust collection. Examples of the wavelength conversion member 42 include a sintered body made of or containing a fluorescent material. A light-reflective film may be formed on a portion facing the bottom surface 13a or such other position. The light-reflective film can employ similar to the above light-reflective film that can be used for the light-reflective member 31.

When the light-emitting device 40 having such a structure is manufactured, the semiconductor laser element 20 can be positioned and mounted as in the first and second embodiments. The order of mounting respective members may be different from the order in the first and second embodiments. In the mounting, for example, the semiconductor laser element 20, the lens 19, the prism 41, and the wavelength conversion member 42 are positioned in this order. One or more members are preferably positioned with the laser emitting light as in the first embodiment. In this case, for example, the semiconductor laser element 20, the lens 19, and the wavelength conversion member 42 are first mounted on or above the base 46, and the semiconductor laser element 20 is electrically connected to the wiring layers 23 via wires 81 or other component. Subsequently, an appropriate mounting position of the prism 41 is identified with the semiconductor laser element 20 laser-emitting light, and the prism 41 is mounted. The mounting position of the lens 19 can also be identified with the laser emitting light, but a slight change in the position of the lens 19 tends to largely change the direction of the laser light. Thus, it is more preferable that the lens 19 be mounted on the basis of the predetermined point as it is for the semiconductor laser element 20, and that only the mounting position of the prism 41 be identified with the laser emitting light.

As described above, in the light-emitting device 40, components such as the semiconductor laser element 20 are positioned and mounted on or above the base 46 on the basis of the predetermined point on the line connecting the first depressed portion 11 and the second depressed portion 12. Thus, components such as the semiconductor laser element 20 are more precisely mounted than when components such as the semiconductor laser element 20 are positioned on the basis of the outer shape of the base 46 or other member.

Fourth Embodiment: Light-Emitting Device

Figure 5A:
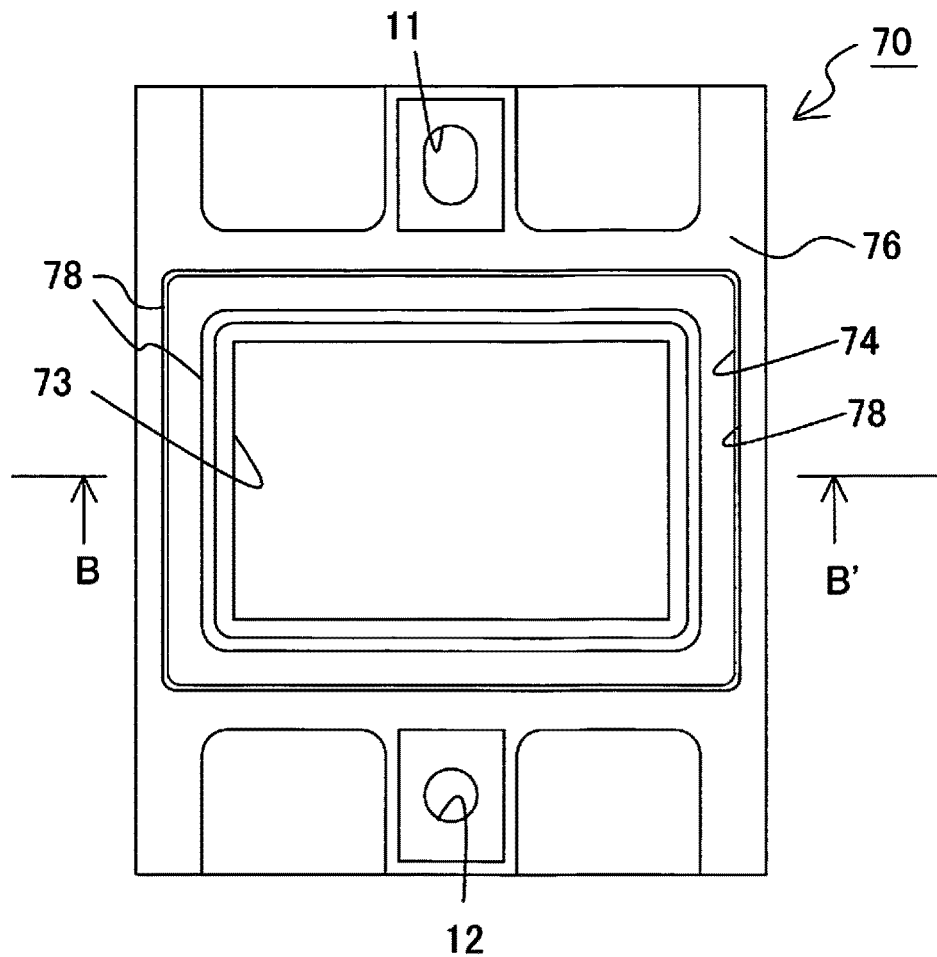
FIG. 5A is a schematic cross-sectional view of the light-emitting device according to the third embodiment.
Figure 5B:
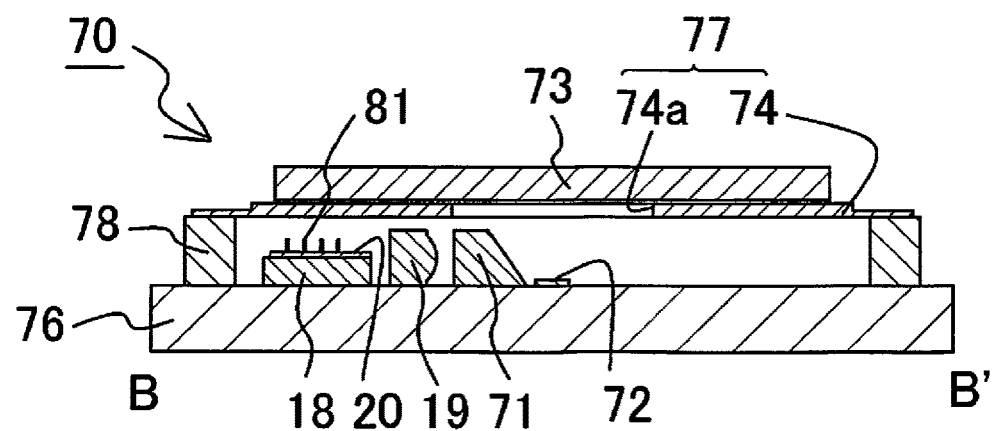
FIG. 5B is a schematic cross-sectional view along the line B-B' in FIG. 5A.

A light-emitting device 70 according to the present embodiment 4 has substantially the same structure as the light-emitting device 40 shown in FIG. 4 except that a base shown in FIGS. 5A and 5B is used.

A base 76 has a flat plate shape without the third depressed portion. Accordingly, the base 76 is less likely to be warped compared with the case where the third depressed portion is formed. When the third depressed portion is formed, the maximum thickness of the base is required to be large enough that the third depressed portion can be formed. When such a base having the third depressed portion includes a ceramic as a main component, the number of ceramic layers increases, and thus the base easily warps due to shrinkage in size in sintering or other factor. When the third depressed portion is not formed, the base 76 requires less ceramic layers. Thus, the degree of deformation of the base 76 can be reduced, thereby reducing warpage.

When the base 76 has a flat plate shape, a space for components such as the semiconductor laser element 20 can be defined by surrounding the space with a member other than the base 76, such as a metal frame 78.

Preferably, a lid 77 is joined to the metal frame 78. The lid 77 includes a holding member 74 having a through hole 74a and a light-transmissive member 73 covering the through hole 74a.

The metal frame 78 is higher than components such as the semiconductor laser element 20.

The metal frame 78 houses the semiconductor laser element 20 disposed on the submount 18, the lens 19, a prism 71, and a wavelength conversion member 72.

Fifth Embodiment: Method for Manufacturing Laser Module

Figure 6A:
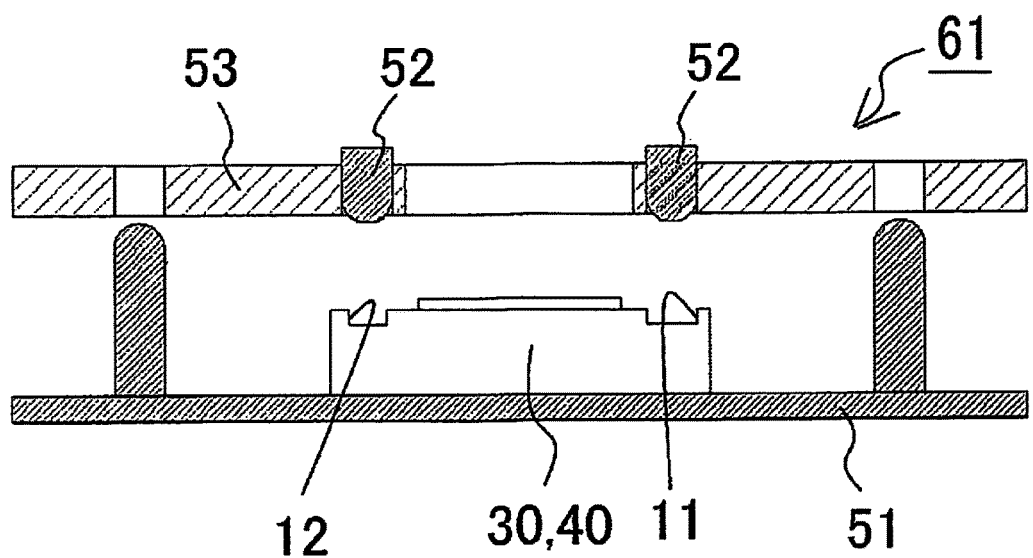
FIG. 6A is a schematic cross-sectional view for illustrating a step in a method for manufacturing a laser module according to a fifth embodiment.
Figure 6B:
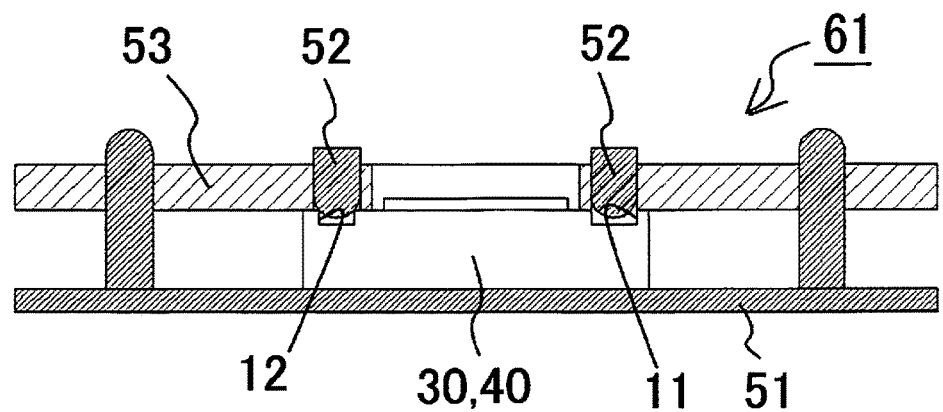
FIG. 6B is a schematic cross-sectional view for illustrating a step in the method for manufacturing a laser module according to the fifth embodiment.

In a method for manufacturing a laser module according to the present embodiment, the light-emitting device 30 or 40 is first disposed on a heat dissipation member 51 as shown in FIGS. 6A and 6B. An attachment 61 having positioning members 52 is disposed above the light-emitting device 30 or 40, and the positioning members 52 are respectively inserted into the above first and second depressed portions 11 and 12 of the light-emitting device 30 or 40, such that the light-emitting device 30 or 40 is aligned with respect to the attachment 61. At this position, the light-emitting device 30 or 40 is clamped between the heat dissipation member 51 and the attachment 61. The method for manufacturing a laser module according to the present embodiment includes the above steps. The term "light-emitting device 30 or 40" means that any of the light-emitting device 30 and the light-emitting device 40 can be used.

Inserting Positioning Members

The attachment 61 includes the positioning members 52 that can be respectively inserted into the first depressed portion 11 and the second depressed portion 12. The positioning members 52 can each have a tapered shape in which one end in the height direction has a width larger than the opening of the second depressed portion 12 and the other end of which has a width smaller than the opening of the second depressed portion 12.

The tapered tip portions of the positioning members 52 are respectively inserted into the first depressed portion 11 and the second depressed portion 12, such that the light-emitting device 30 or 40 can be aligned with respect to the heat dissipation member 51. This structure can discourage the light-emitting device 30 or 40 from being out of precise alignment with respect to the heat dissipation member 51. In particular, this structure is preferable when the semiconductor laser element is mounted on the basis of the first depressed portion 11 and the second depressed portion 12 in the above method for manufacturing a light-emitting device. This is because mispositioning of the light emitting point can be reduced by mounting the semiconductor laser element on the basis of the first depressed portion 11 and the second depressed portion 12 and then aligning the light-emitting device 30 or 40 with respect to the heat dissipation member 51 on the basis of the positions of the first depressed portion 11 and the second depressed portion 12 in a similar manner.

In addition, the two positioning members 52 can fit into a supporting member 53, such that the supporting member 53 defines the interval between the positioning members 52. For example, the positioning members 52 fit into through holes formed through the supporting member 53, and their upper surfaces are loosely pressed by flat springs such that the positioning members 52 can move up and down in the thickness direction of the supporting member 53. In this case, the flat springs are magnetized to magnetically attach the positioning members 52 to the flat springs. If the positioning members 52 are not fixed to the supporting member 53 but are held so as to be movable up and down, both of the two positioning members 52 can be more securely in contact respectively with the first depressed portion 11 and the second depressed portion 12. That is, even if one of the two positioning members 52 has come into contact with the first depressed portion 11 or the second depressed portion 12 first, the other positioning member 52 that has not yet come into contact can get into contact with the other one of the first depressed portion 11 and the second depressed portion 12 by additionally pushing the attachment 61.

The positioning member 52 preferably has a diameter larger than the diameter of the opening of the second depressed portion 12, and preferably has a tapered shape in which the tip portion to be inserted into the second depressed portion 12 is tapered toward the bottom surface of the second depressed portion 12 so that the tip portion of the positioning member 52 has a diameter smaller than the diameter of the opening of the second depressed portion 52 as shown in FIGS. 6A and 6B. In addition, the tip portion of the positioning member 52 preferably does not reach the bottom surface of the second depressed portion 12 when the positioning member 52 is inserted to the point where the positioning member 52 is into contact with the upper end of the second depressed portion 12. In other words, its height from the lowermost end to the point in contact with the upper end of the second depressed portion 12 is smaller than the height from the bottom surface to the upper end of the second depressed portion 12. With this structure, positioning can be performed not by contact of the positioning member 52 with the bottom surface of the second depressed portion 12 but by contact with the upper end of the second depressed portion 12. Thus, alignment can be performed by inserting part of the tip portion of the positioning member 52 into the second depressed portion 12 even if the depth and/or the opening width of the second depressed portion 12 is deviated from its design value. Also, since alignment is performed using the upper end (edge of the opening) of the second depressed portion, the alignment can be performed using only the uppermost layer among a plurality of green sheets regardless of mispositioning of layers other than the uppermost layer.

When the distance between the first depressed portion 11 and the second depressed portion 12 deviates from its design value, it is possible that only one of the two positioning members 52 can be inserted into one of the first depressed portion 11 and the second depressed portion 12, but not the other one of the two positioning members 52.

To reduce this disadvantage, the first depressed portion 11 is longer than the second depressed portion 12 in a direction along the line connecting the first depressed portion 11 and the second depressed portion 12 in the light-emitting device 30 or 40. With this structure, the two positioning members 52 can be respectively inserted into the first depressed portion 11 and the second depressed portion 12 even if the distance from the second depressed portion 12 to the first depressed portion 11 is larger than its design value, for example.

The positioning member 52 to be inserted into the first depressed portion 11 is preferably formed such that a gap will exist between the positioning member 52 and a side wall of the first depressed portion 11 in a direction connecting the first depressed portion 11 and the second depressed portion 12 in a state where the alignment of the light-emitting device 30 or 40 has been done by respectively inserting the positioning members 52 into the first depressed portion 11 and the second depressed portion 12. With this structure, the two positioning members 52 can be respectively inserted into the first depressed portion 11 and the second depressed portion 12, and alignment of the light-emitting device 30 or 40 can be performed, even if the distance between the first depressed portion 11 and the second depressed portion 12 deviates from its design value.

In this case, the positioning member 52 is preferably in contact with the upper end of the first depressed portion 11 in a cross-sectional view along a direction intersecting with the line connecting the first depressed portion 11 and the second depressed portion 12. Specifically, the tip portion of the positioning member 52 to be inserted into the first depressed portion 11 preferably has a shape tapered toward the bottom surface of the first depressed portion 11 from a width larger than the opening of the first depressed portion 11 in a cross-sectional view along a direction intersecting with the line connecting the first depressed portion 11 and the second depressed portion 12. The tip portion of this positioning member 52 preferably does not reach the bottom surface of the first depressed portion 11 when the positioning member 52 is inserted to the point where the positioning member 52 gets contact with the upper end of the first depressed portion 11. In other words, its height from the lowermost end to the point in contact with the upper end of the first depressed portion 11 is smaller than the height from the bottom surface to the upper end of the first depressed portion 11. Thus, positioning can be performed by inserting part of the tip portion of the positioning member 52 into the first depressed portion 11 even if the depth and/or the opening width of the first depressed portion 11 deviates from its design value. For example, the positioning member 52 to be inserted into the first depressed portion 11 can have substantially the same shape and size as the positioning member 52 to be inserted into the second depressed portion 12. Accordingly, which positioning member 52 is inserted into which of the first depressed portion 11 and the second depressed portion 12 can be selective.

In addition, the positioning member 52 to be inserted into the first depressed portion 11 is preferably disposed such that its center or centroid will approximately coincide with the center or center of gravity of the first depressed portion 11 in a plan view when the first depressed portion 11 and the second depressed portion 12 is formed in accordance with their design values. This structure enables the positioning members 52 to be inserted into both of the first depressed portion 11 and the second depressed portion 12 even if the distance between the first depressed portion 11 and the second depressed portion 12 is larger than or smaller than its design value.

The heat dissipation member 51, the supporting member 53, the positioning members 52, and such other members preferably have small coefficients of thermal expansion and/or good thermal conductivities. For example, metals, ceramics, resins, or combinations of these can be used. In particular, the heat dissipation member 51 is preferably made of a material having good heat dissipation performance. Examples thereof include metals such as aluminum and copper. When the positioning members 52 are magnetically attached to the flat springs connected to the supporting member 53 as described above, the flat springs are preferably formed of a magnetizable material, and the positioning members 52 are preferably formed of a metal that can be magnetically attached. The positioning members 52 are, for example, positioning pins. Examples of the shape of the positioning members 52 include rod shapes, bullet shapes, and pillar shapes. Portions of the positioning members 52 that may be inserted into the first depressed portion 11 and the second depressed portion 12 each have, for example, an approximately hemispherical shape. For example, the outer edge of the second depressed portion 12 forms an approximately circular shape, the outer edge of the first depressed portion 11 forms an approximately oval shape in which two halves of the above circle are connected by a rectangle, and the tip portions of the positioning members 52 each have a curve having a curvature radius larger than the radius of the outer edge of the second depressed portion 12.

Figure 7A:
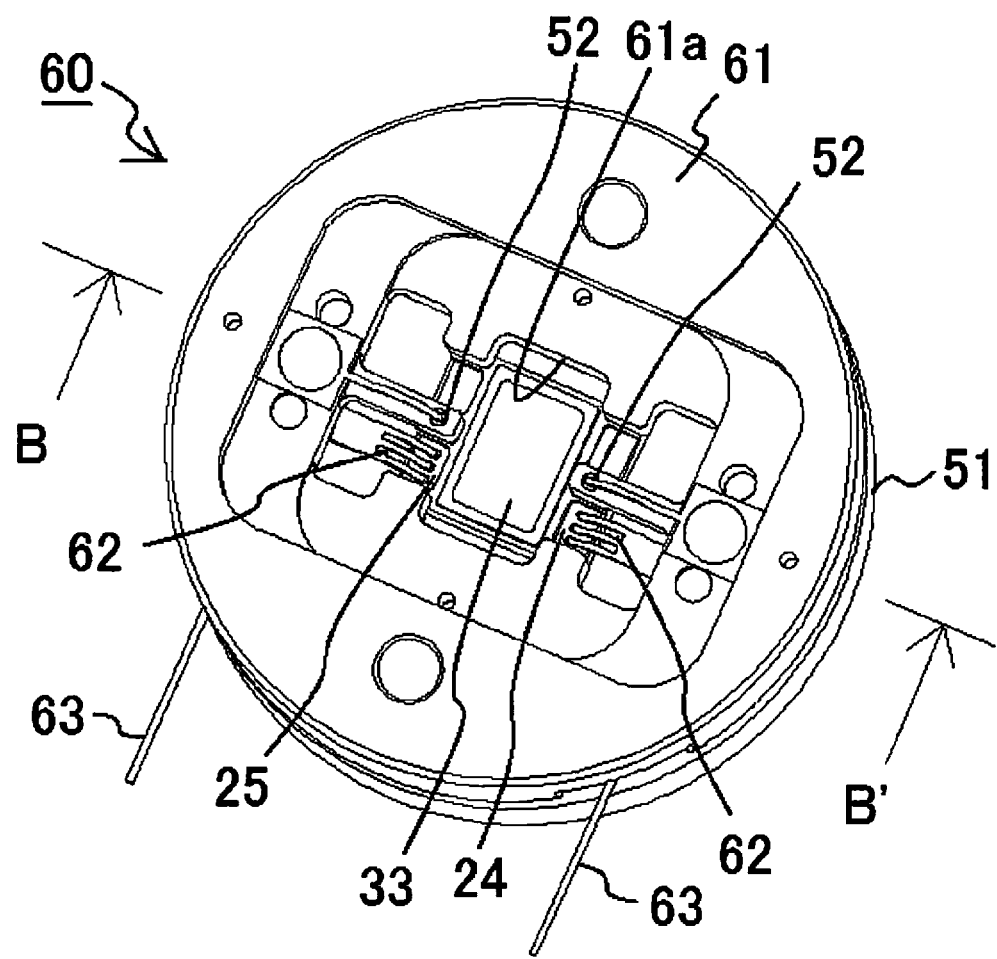
FIG. 7A is a schematic perspective view of a laser module obtained by the method for manufacturing a laser module according to the fifth embodiment.
Figure 7B:
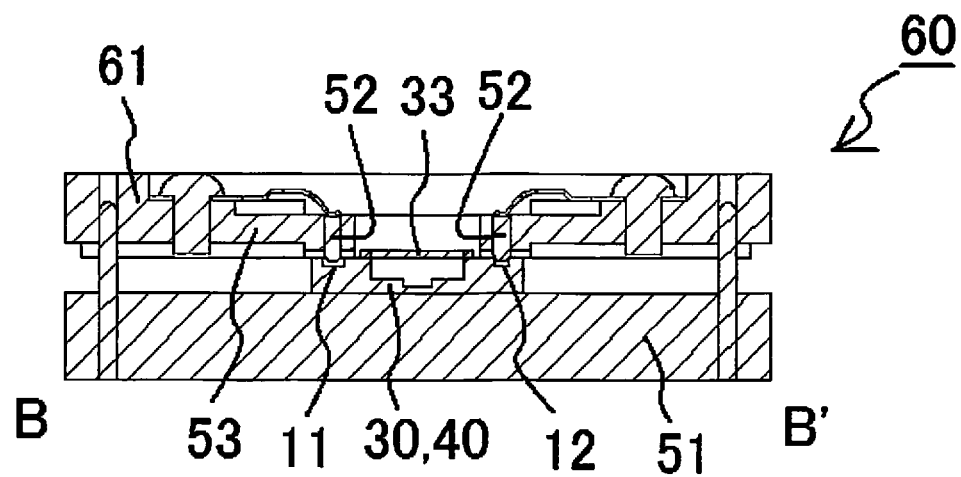
FIG. 7B is a schematic cross-sectional view along the line B-B' in FIG. 7A.

For example, as shown in FIGS. 7A and 7B, the heat dissipation member 51, the supporting member 53, and the positioning members 52 can be disposed as components constituting a laser module 60.

The laser module 60 includes, for example, the heat dissipation member 51 covering the back surface of the light-emitting device 30 or 40, and the attachment 61 that can cover the upper surface of the light-emitting device 30 or 40. The attachment 61 has an opening 61a that light from the light-emitting device 30 or 40 can travel through. A light-transmissive member such as glass can be disposed in the opening 61a. The attachment 61 includes wirings 62 electrically connected to the external electrodes 24 and 25 of the light-emitting device 30 or 40 and further includes terminals 63 electrically connected to the wirings 62. Electrically connecting the terminals 63 to an external power supply can supply electricity to the light-emitting device 30 or 40, which can then emit light.

The attachment 61 includes the supporting member 53 as a constituent.

Thus, after disposing the light-emitting device 30 or 40 on the heat dissipation member 51, the attachment 61 can be fitted from above the light-emitting device 30 or 40 such that the positioning members 52 are respectively inserted into the first depressed portion 11 and the second depressed portion 12. By this procedure, the wirings 62 are respectively connected to the external electrodes 24 and 25 of the light-emitting device 30 or 40, and a laser module in which the light emitting point of the light-emitting device 30 or 40 is precisely located at an appropriate position can be assembled.

In the laser module 60, the light-emitting device 30 or 40 is fixed to the heat dissipation member 51 and the attachment 61 by interposing the light-emitting device 30 or 40 between the heat dissipation member 51 and the attachment 61. For example, after aligning the light-emitting device 30 or 40 with respect to the attachment 61 using the positioning members 52, the attachment 61 is screwed to the heat dissipation member 51. Tightness of the screwing may be adjusted such that the light-emitting device 30 or 40 does not fall off even if the laser module 60 is subjected to movement or other influence. With this structure, the light-emitting device 30 or 40 can be fixed to the heat dissipation member 51 and the attachment 61 without adhesives. Fixing the light-emitting device 30 or 40 without adhesives facilitates exchange of the light-emitting device 30 or 40. The light-emitting device 30 or 40 can be fixed by pressing the light-emitting device 30 or 40 against the heat dissipation member 51 with the positioning members 52, but the smaller the sizes of the positioning members 52 are, the larger a local load on the light-emitting device 30 or 40 tends to be. Thus, the light-emitting device 30 or 40 is preferably fixed by interposing it between the heat dissipation member 51 that is in contact with approximately the entire lower surface of the light-emitting device 30 or 40 and the supporting member 53 such that the supporting member 53 is in contact with a relatively large area, such as an area larger than the total area of the bottom surfaces of the first depressed portion 11 and the second depressed portion 12, of the light-emitting device 30 or 40. This structure can distribute the load on the light-emitting device 30 or 40. For example, the four corners of the base 16 are in contact with the supporting member 53.

Alternatively, protrusions disposed on the heat dissipation member 51 may engage with holes formed in the supporting member 53 as shown in FIG. 6A and FIG. 6B. In this case, the length of the protrusions of the heat dissipation member 51 is preferably large enough to allow the protrusions of the heat dissipation member 51 to be inserted into the holes of the supporting member 53 before the positioning members 52 get contact with the first depressed portion 11 and the second depressed portion 12. With this structure, the positional relation between the heat dissipation member 51 and the supporting member 53 is determined, and thereafter the positional relation between the heat dissipation member 51 engaged with the supporting member 53 and the light-emitting device 30 or 40 can be then determined by respectively inserting the positioning members 52 into the first depressed portion 11 and the second depressed portion 12.

As described above, the light emitting point can be more accurately aligned in the module by incorporating the light-emitting device into the module on the basis of the first depressed portion 11 and the second depressed portion 12.

What is claimed is:

1. A method for manufacturing a light-emitting device comprising:

providing a base including a first depressed portion and a second depressed portion both upwardly opening;
positioning and mounting at least one semiconductor laser element on or above the base using a predetermined point on a line connecting the first depressed portion and the second depressed portion in a plan view as a reference so that the at least one semiconductor laser element is spaced apart from the predetermined point; and
joining a lid to the base to enclose the at least one semiconductor laser element with the lid being disposed between the first depressed portion and the second depressed portion in the plan view, the lid being configured to upwardly transmit light from the at least one semiconductor laser element.

2. The method for manufacturing a light-emitting device according to claim 1, wherein
the predetermined point is a midpoint of the line connecting the first depressed portion and the second depressed portion.

3. The method for manufacturing a light-emitting device according to claim 1, further comprising
positioning and mounting a wavelength conversion member on or above the base using the predetermined point as a reference in a plan view,
wherein the wavelength conversion member converts a wavelength of light emitted from the at least one semiconductor laser element.

4. The method for manufacturing a light-emitting device according to claim 1, further comprising
positioning and mounting a light-reflective member on or above the base using the predetermined point as a reference in a plan view,
wherein the reflecting member reflects light emitted from the at least one semiconductor laser element.

5. The method for manufacturing a light-emitting device according to claim 1, further comprising:
after the mounting of the at least one semiconductor laser element, operating the at least one semiconductor laser element; and
disposing an optical member on an optical path of laser light emitted from the at least one semiconductor laser element so as to allow the laser light to reach a predetermined position through the optical member in a plan view.

6. A method for manufacturing a light-emitting device comprising:
providing a base including a first depressed portion and a second depressed portion both upwardly opening;
positioning and mounting at least one semiconductor laser element on or above the base using a predetermined point on a line connecting the first depressed portion and the second depressed portion in a plan view as a reference;
identifying an inner edge of a first metal layer and an inner edge of a second metal layer by image recognition, the first metal layer and the second metal layer being part of the base with the first metal layer being adjacent to and surrounding the first depressed portion and the second metal layer being adjacent to and surrounding the second depressed portion in a plan view;
determining the line connecting the first depressed portion and the second depressed portion using the inner edge of the first metal layer and the inner edge of the second metal layer; and
determining the predetermined point using the line.

7. The method for manufacturing a light-emitting device according to claim 1, further comprising:
before the mounting of the at least one semiconductor laser element, identifying a center or center of gravity of each of the first depressed portion and the second depressed portion; and
determining the predetermined point using a line connecting the center or center of gravity of the first depressed portion and the center or center of gravity of the second depressed portion.

8. A method for manufacturing a laser module comprising:
manufacturing a light-emitting device by
providing a base including a first depressed portion and a second depressed portion both upwardly opening, and
positioning and mounting at least one semiconductor laser element on or above the base using a predetermined point on a line connecting the first depressed portion and the second depressed portion in a plan view as a reference;
disposing the light-emitting device on a heat dissipation member; and
clamping the light-emitting device between the heat dissipation member and an attachment having a first positioning member and a second positioning member at a position determined by aligning the light-emitting device with respect to the attachment by respectively inserting the first positioning member and the second positioning member into the first depressed portion and the second depressed portion.

9. The method for manufacturing a laser module according to claim 8, wherein
the first depressed portion is longer than the second depressed portion in a direction along the line connecting the first depressed portion and the second depressed portion in a plan view, and
in the clamping of the light-emitting device, a gap is formed between the first positioning member and a side wall of the first depressed portion in the direction along the line connecting the first depressed portion and the second depressed portion in a state where the light-emitting device is aligned.

10. The method for manufacturing a laser module according to claim 8, wherein
the second positioning member has a tip portion with a tapered shape having an upper portion having a diameter larger than a diameter of the opening of the second depressed portion and a lower portion having a diameter smaller than the diameter of the opening of the second depressed portion, and
in the clamping the light-emitting device, the second positioning member comes in contact with an upper end of the second depressed portion and the tip portion of the second positioning member does not reach a bottom surface of the second depressed portion in a state where the light-emitting device is aligned.

11. A light-emitting device comprising:
a base including a first depressed portion and a second depressed portion both upwardly opening;
at least one semiconductor laser element disposed on or above the base; and
a lid joined to the base to enclose the at least one semiconductor laser element and upwardly transmit light from the at least one semiconductor laser element, the lid being disposed between the first depressed portion and the second depressed portion in a plan view wherein a light emitting point of the light-emitting device is located at a position overlapping a predetermined point on a line connecting the first depressed portion and the second depressed portion or at a position a predetermined distance away from the predetermined point in a plan view.

12. The light-emitting device according to claim 11, wherein
the first depressed portion is longer than the second depressed portion in a direction along the line connecting the first depressed portion and the second depressed portion in a plan view.

13. The light-emitting device according to claim 11, wherein
the base includes a ceramic portion, and
the first depressed portion and the second depressed portion are disposed in the ceramic portion.

14. The light-emitting device according to claim 13, wherein
the base includes
a first metal layer adjacent to and surrounding the first depressed portion in a plan view, and
a second metal layer adjacent to and surrounding the second depressed portion in a plan view.

15. The light-emitting device according to claim 11, wherein
the light emitting point is located on a midpoint of the line connecting the first depressed portion and the second depressed portion or on a perpendicular bisector of the line.

16. The light-emitting device according to claim 11, wherein
the base has a third depressed portion that is upwardly opening and positioned between the first depressed portion and the second depressed portion, and
the at least one semiconductor laser element is disposed on or above a bottom surface of the third depressed portion.

17. The light-emitting device according to claim 16, wherein
the lid is joined to the base to cover an opening of the third depressed portion, and
the lid includes a light-transmissive member transmitting the light from the at least one semiconductor laser element.

18. The light-emitting device according to claim 11, further comprising
a wavelength conversion member converting a wavelength of the light emitted from the at least one semiconductor laser element,
wherein the wavelength conversion member is disposed at a position overlapping the light emitting point in a plan view.

19. The light-emitting device according to claim 11, further comprising
a light-reflective member upwardly reflecting light emitted from the at least one semiconductor laser element,
wherein the light-reflective member is disposed at a position overlapping the light emitting point in a plan view.

* * * * *